(12) United States Patent
Chan et al.

(10) Patent No.: US 6,866,741 B2
(45) Date of Patent: Mar. 15, 2005

(54) METHOD FOR JOINING LARGE SUBSTRATES

(75) Inventors: Albert W. Chan, Cupertino, CA (US); Michael G. Lee, San Jose, CA (US); Mark Thomas McCormack, Livermore, CA (US); Solomon I. Beilin, San Carlos, CA (US)

(73) Assignee: Fujitsu Limited, Kawasaki (JP)

( * ) Notice: Subject to any disclaimer, the term of this patent is extended or adjusted under 35 U.S.C. 154(b) by 278 days.

(21) Appl. No.: 09/757,364

(22) Filed: Jan. 8, 2001

(65) Prior Publication Data
US 2002/0088540 A1 Jul. 11, 2002

(51) Int. Cl.[7] .............................................. H01L 21/46
(52) U.S. Cl. ........................ 156/292; 156/295; 29/830; 438/455
(58) Field of Search .............................. 156/297, 292, 156/295; 438/455, 456, 458, 108, 118; 29/830, 832, 739, 740; 257/778

(56) References Cited

U.S. PATENT DOCUMENTS

| | | | |
|---|---|---|---|
| 4,803,124 A * | 2/1989 | Kunz | 428/200 |
| 5,128,746 A | 7/1992 | Pennisi | |
| 5,157,828 A | 10/1992 | Coques et al. | |
| 5,183,969 A | 2/1993 | Odashima | |
| 5,187,123 A | 2/1993 | Yoshida | |
| 5,232,532 A | 8/1993 | Hori | |
| 5,334,260 A * | 8/1994 | Stefanowski | 228/223 |
| 5,376,403 A | 12/1994 | Capote et al. | |
| 5,423,889 A | 6/1995 | Colquitt et al. | |
| 5,681,757 A | 10/1997 | Hayes | |
| 5,819,406 A | 10/1998 | Yoshizawa et al. | |
| 5,839,188 A | 11/1998 | Pommer | |
| 5,842,273 A | 12/1998 | Schar | |
| 5,843,251 A | 12/1998 | Tsukagoshi et al. | |
| 5,873,161 A * | 2/1999 | Chen et al. | 29/830 |
| 5,918,113 A * | 6/1999 | Higashi et al. | 438/119 |
| 5,985,043 A * | 11/1999 | Zhou et al. | 148/24 |
| 6,133,066 A * | 10/2000 | Murakami | 438/108 |
| 6,207,475 B1 * | 3/2001 | Lin et al. | 438/108 |
| 6,458,472 B1 * | 10/2002 | Konarski et al. | 428/620 |
| 6,467,676 B1 * | 10/2002 | Wang | 228/180.22 |
| 6,518,096 B2 * | 2/2003 | Chan et al. | 438/118 |

OTHER PUBLICATIONS

Tummala, Editor, "Microelectronics Packaging Handbook", 1997, Forward, pp. III–164–169, II–670–677, International Thompson Publishing, Florence, Kentucky.

* cited by examiner

Primary Examiner—John T. Haran
(74) Attorney, Agent, or Firm—Sheppard Mullin Richter & Hampton LLP

(57) ABSTRACT

A method for joining large area semiconductor substrates, a liquid thermoset polymer. Two large area substrates, such as wafers or circuit boards (e.g., rigid or flexible), can be joined together by dispensing a liquid polymer inwardly from the edges of the semiconductor substrates. The substrates can then be pressed together so that the liquid thermoset flows in an outwardly direction ward the edges of the semiconductor substrates. Conducting surfaces on the first and second substrates may contact each other after pressing the liquid thermoset polymer. The liquid thermoset polymer in the formed structure may then be cured to a hardened state. The liquid thermoset polymer preferable has a low viscosity, low levels of ionic contaminants, good adhesion to the substrates, low moisture absorbing properties and favorable thermal expansion properties.

21 Claims, 3 Drawing Sheets

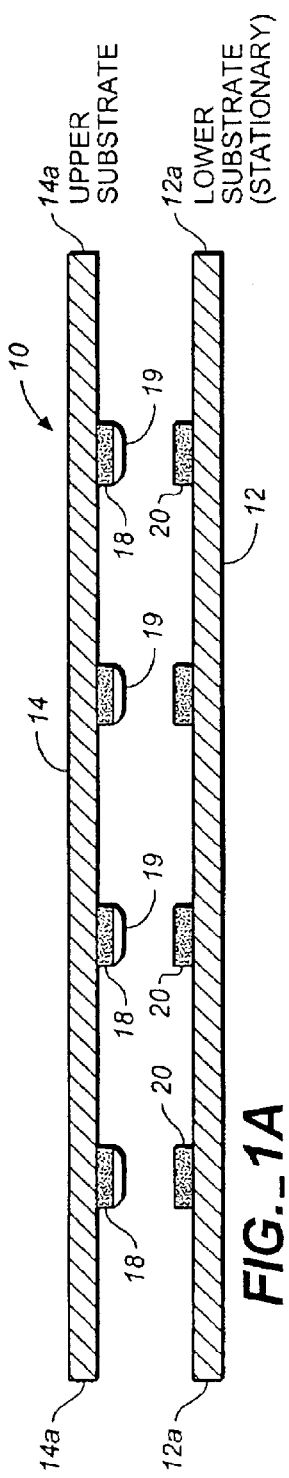
FIG._1A
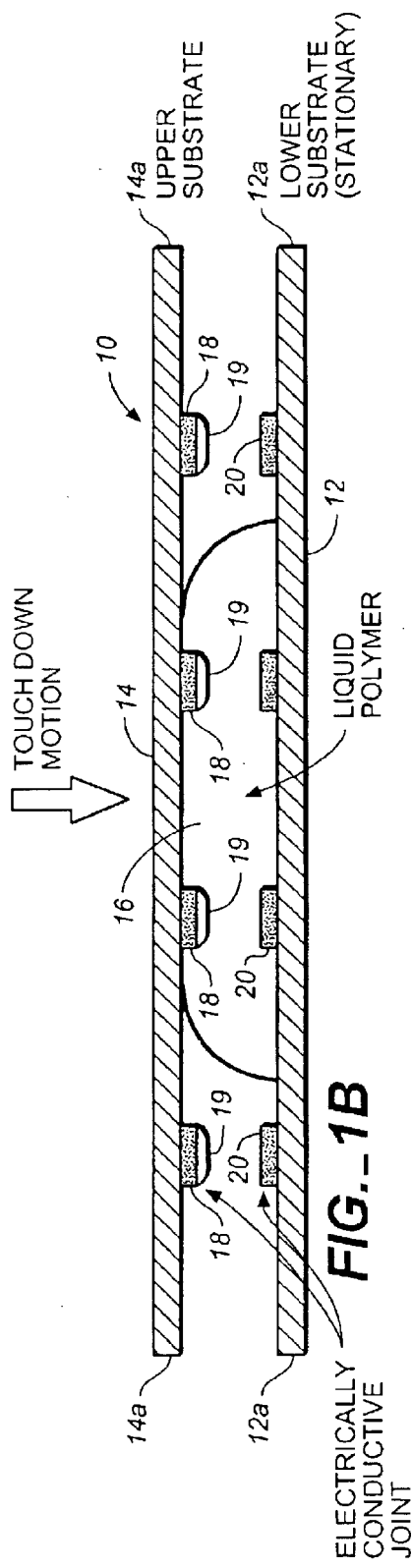
FIG._1B
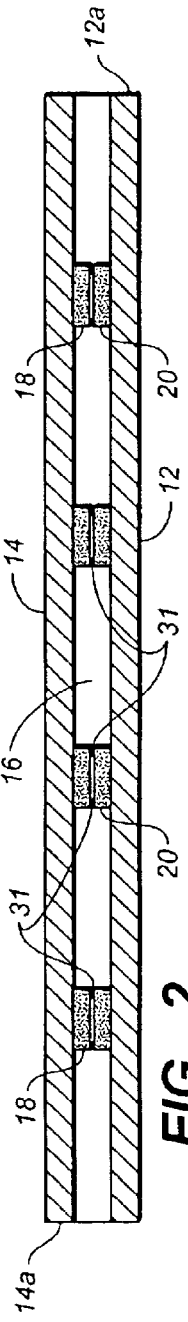
FIG._2

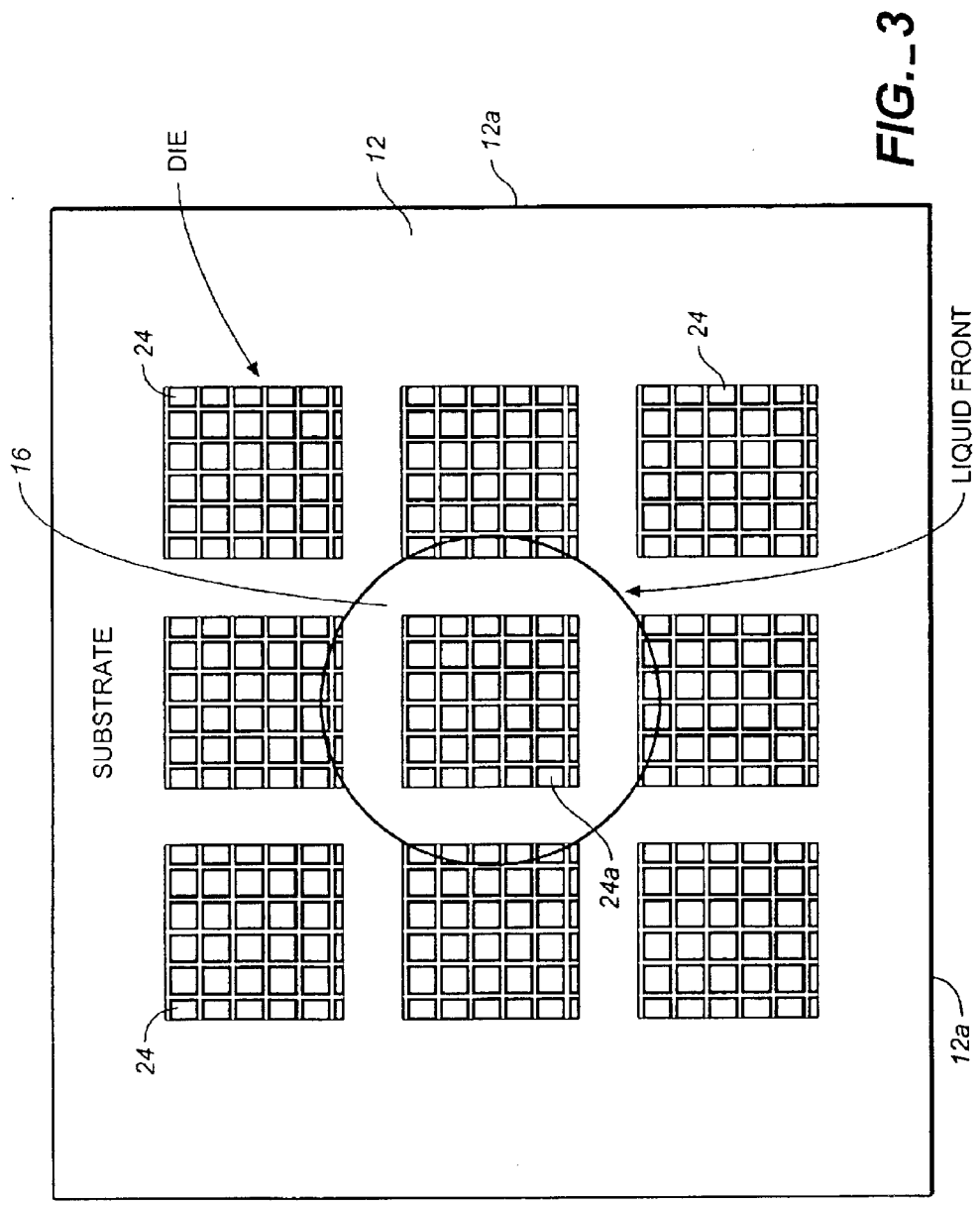
FIG._3

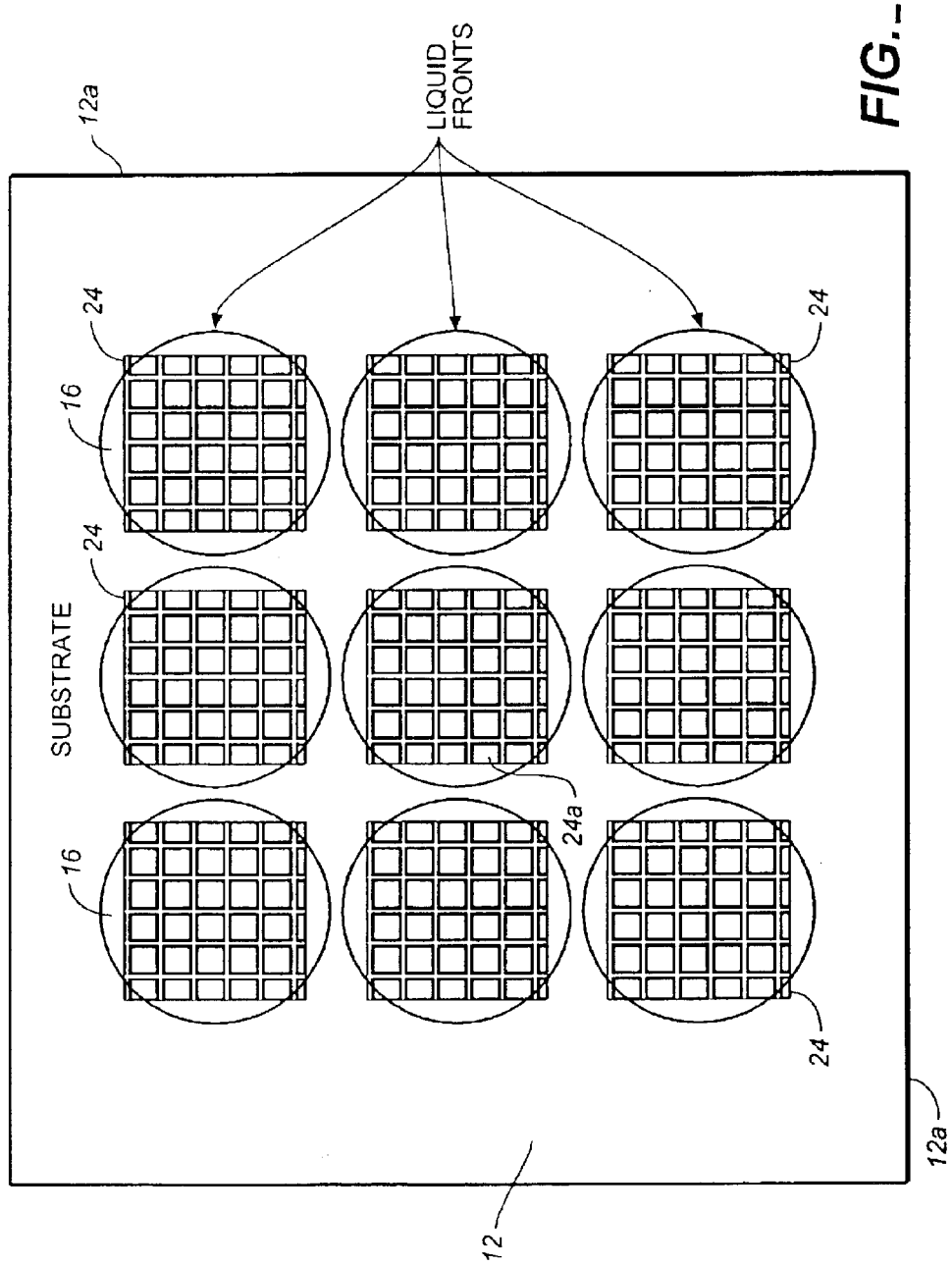
FIG._4

METHOD FOR JOINING LARGE SUBSTRATES

BACKGROUND OF THE INVENTION

1. Field of the Invention

This invention is related to joining semiconductor substrates. More specifically, the present invention provides a method for joining or coupling together large substrates.

2. Description of the Prior Art

A patentability investigation was conducted and the following U.S. Patents were discovered: U.S. Pat. No. 5,376,403 to Capote et al.; U.S. Pat. No. 5,128,746 to Pennisi et al.; U.S. Pat. No. 5,232,532 to Hori; U.S. Pat. No. 5,157,828 to Coques et al.; U.S. Pat. No. 5,187,123 to Yoshida et al.; U.S. Pat. No. 5,839,188 to Pommer; and U.S. Pat. No. 5,842,273 to Schor.

U.S. Pat. No. 5,376,403 to Capote et al. discloses electrically conductive compositions which contain metal and solder in addition to polymer forming constituents. A technique is described for eliminating voids in bonding a chip to a flexible substrate. A flexible pad or paper is connected to the underside of the flexible substrate, which will deform during bonding and allow air to flow out of the liquid adhesive before it cures and hardens. The adhesive used to bond the chip to the flexible substrate is liquid or paste (not bonding film or sheet) and the objective is air bubble elimination during bonding.

U.S. Pat. No. 5,128,746 to Pennisi et al. teaches a flux containing polymer forming composition. The flux forming constituent is disclosed as an acid selected from the group consisting of abietic acid, adipic acid, ascorbic acid acrylic and, citric acid, and malic acid.

U.S. Pat. No. 5,232,532 to Hori describes a technique for eliminating voids in bonding of a chip to a flexible substrate. The goal is to use flexible pad or paper underneath the flexible substrate, which will deform during bonding and allow air to flow out of the liquid adhesive before it cures and hardens.

U.S. Pat. No. 5,127,828 to Coques et al. describes use of an adhesive loop between a substrate and a support so that a partial vacuum may be applied to the space between the substrate and the support. The objective is to have uniform squeezing of adhesive and therefore uniform spacing between the substrate and the support after the adhesive is cured.

U.S. Pat. No. 5,187,123 to Yoshida et al. describes a void free adhesive layer in bonding of a semiconductor device to a lead frame. The main area of adhesive application is the back side of the die. There is no metal connection between the semiconductor device and the lead frame. The adhesive is applied in liquid or paste form in several pre-arranged spots, so as to prevent formation of voids during semiconductor device attachment onto a lead frame.

U.S. Pat. No. 5,839,188 to Pommer discloses the use of non-conductive particles (i.e., "gauge" particles) to provide a uniform gap or separation between two or more substrates, and the use of conductive pastes of copper post/tin to form an electrical interconnection.

U.S. Pat. No. 5,842,273 to Schor discloses the use of a conductive adhesive to from an electrical connection between substrates. The adhesive is an elastomeric thermoset with conductive particles, flakes, etc. No solder is used. Electrical connection is primarily through metal contact.

Conventional underfill process, such as that disclosed in the foregoing prior art, for flip chip to substrate jointing is limited to very small joining areas (typically 1-inch by 1-inch area or less). Substrate buildup is expensive. Therefore, what is needed and what has been invented is an economical method for establishing Z-connection between two or more large area substrates through a two-step tack lamination and final lamination process.

SUMMARY OF THE INVENTION

The present inventors provides a method for producing an assembly of substrates comprising dispensing a liquid polymeric material between a conducting surface on a first substantially planar substrate and a conducting surface on a second substantially planar substrate. The liquid polymeric material is preferably disposed inwardly from the edges of the first substrate and the second substrate; The method further includes pressing the liquid polymeric material between the first substrate and the second substrate so that the liquid polymeric flows towards the edges of the first substrate and the second substrate; and curing the liquid polymeric material. The conducting surface on the first substrate is placed in contact with the conducting surface on the second substrate after pressing the liquid polymeric material between the first substrate and the second substrate. In another embodiment of the invention the liquid polymeric material is dispensed on dies present on the first or second substrate. Preferably at least one of the substrates has a planar surface area of at least 36 sq. inches, such as a dimension of from about 6 inches to about 6 inches.

The conducting surface of one of the planar substrates includes a solder bump which may or may not have a solder material fluxing agent. The liquid polymeric material comprises from about 15% by weight to about 70% by weight of a polymeric resin, from about 15% by weight to about 70% by weight of a curing agent, and from about 0.10% by weight to about 20% by weight of a polymer fluxing agent. The polymer fluxing agent comprises a beta phenylacid and/or a beta phenylhydroxyacid. The beta phenylacid is selected from the group consisting of beta phenylacetic acid, beta phenylacrylic acid, beta phenylcrotonic acid, and mixtures thereof.

The present invention further provides a polymeric composition comprising from about 15% by weight to about 70% by weight of a polymeric resin, from about 15% by weight to about 70% by weight of a curing agent, and from about 0.10% by weight to about 20% by weight of a fluxing agent. The present invention also further provides an assembly of substrates comprising a lower substrate; a polymeric composition disposed on said lower substrate; and an upper substrate disposed on said polymeric composition which comprises from about 15% by weight to about 70% by weight of a polymeric resin, from about 15% by weight to about 70% by weight of a curing agent, and from about 0.10% by weight to about 20% by weight of a fluxing agent.

These provisions together with the various ancillary provisions and features which will become apparent to those skilled in the art as the following description proceeds, are attained by the methods and stencils of the present invention, preferred embodiments thereof being shown with reference to the accompanying drawings, by way of example only, wherein:

BRIEF DESCRIPTION OF THE DRAWINGS

FIGS. 1a and 1b are vertical sectional views of a pair of spaced large substrates, where FIG. 1a is a view of the substrates prior to their attachment, and FIG. 2b is a view showing the liquid polymer of the present invention supported by the lower substrate and in contact with the upper substrate prior to compressing the pair of spaced large substrates and causing the liquid polymer to flow (i.e. to squeeze flow) towards the perimetric edges of the lower and upper substrates;

FIG. 2 is the vertical sectional view of the pair of substrates of FIG. 1 after the substrates are joined together;

FIG. 3 is a top plan view of a lower substrate supporting a plurality of dies, with dispensed liquid polymer in the center of the lower substrate; and FIG. 4 is a top plan view of a lower substrate supporting a plurality of dies and dispensed liquid polymer disposed on each die.

DETAILED DESCRIPTION OF PREFERRED EMBODIMENTS OF THE INVENTION

Referring in detail now to the drawings, there is seen a substrate assembly, generally illustrated as 10, including a lower substrate 12, an upper substrate 14, and a polymer 16 (e.g., a liquid thermosetting polymer) disposed between lower and upper substrates 12 and 14. The lower substrate 12 and upper substrate 14 have conductor pads 18 and 20 respectively connected thereto. Solder bumps 19 are bound to conductor pads 18 for assisting in coupling together conductor pads 18 and 20. Substrates 12 and 14 respectively have edges 12a and 14a, and may be any suitable substrate (e.g., semiconductor or conductor substrates) selected from flexible substrates, rigid substrates, circuitized substrates, rigid wafers, circuit boards such as PCB or laminated circuit boards, or the like. The substrates 12 and/or 14 are preferably large substrates having a planar surface area equal to or larger than about thirty-six (36) square inches, such as when substrates 12 and/or 14 are dimensioned from about six (6) inches (or greater) to about six (6) inches (or greater).

The liquid polymer 16 may be dispensed concentrically on the lower substrate 12 and over a center die 24a, which is surrounded by a plurality of dies 24, all supported by the lower substrate 12 as best shown in FIG. 3. When the upper substrate 14 is lowered downwardly, the liquid polymer 16 is compressed and squeezed flowed outwardly towards the respective perimetric edges 12a and 14a of the lower substrate 12 and the upper substrate 14. In another embodiment of the present invention, the liquid polymer 16 is superimposed over each of the plurality of dies 24, as best shown in FIG. 4. When the upper substrate 14 is lowered downwardly, the respective disposed polymers 16 are compressed and squeeze flowed outwardly again towards respective perimetric edges 12a and 14a of the lower and upper substrates 12 and 14, respectively.

Therefore, recapitulating as depicted in FIG. 1a, lower substrate 12 has conductor pads 18 and solder bumps 19 that oppose conductor cads 20 of upper substrate 14. As shown in FIG. 1b, a measured amount of liquid polymer 16 is dispensed at specified location or locations on the lower substrate 12. The upper substrate 14 is lowered onto the lower substrate 12, during which it comes in contact with the dispensed polymer 16 and forces the same to move outwards through squeeze flowing. At completion of substrate joining (i.e., when conductor pads 18 and 20 are in contact for reflowing solder bumps 19 as seen in FIG. 2), the joined assembly 10 goes through a heating cycle, well known to those skilled in the art, to form electrically conducting joints 31 (i.e., the joining together of conductor pads 18 and 20 with the assistance of solder bumps 19) and to cure the polymer 16. As shown in FIG. 2, the polymer 16 after curing is an integral part of the joined assembly 10.

The polymer 16 of the present invention provides a semi-hermetic seal for electrically conducting joints and circuitry on substrate surfaces. The polymer 16 also provides stress relief during service. Temperature fluctuations can lead to stresses from coefficient of thermal expansion mismatch among components in the substrate assembly. The polymer 16 also defines a dielectric layer for isolating electrical signals between substrate circuitry. As previously indicated, the polymer 16 can be dispensed at the center region of the lower substrate 12, as shown in FIG. 3, or it can be dispensed individually at each die center, as shown in FIG. 4. When dispensed at the substrate center, the polymer 16 flows outward with a single flow front. For multiple point dispensing, a flow front exists for each dispensing location, which may eventually merge and form fewer flow fronts. Air bubbles may be entrapped when flow fronts merge and joining is done at ambient conditions. Joining under a vacuum environment can eliminate entrapped air bubbles. Single point dispensing is useful for smaller substrates, while multiple point dispensing offers better flow control over each die region in joining of very large area substrates.

Suitable material for solder bumps 19 may be metals, or single or multi-phase alloys. The alloys can be binary, ternary, or other higher order compositions. Examples include eutectic Pb/Sn and alloys comprised of In—Sn, Bi—Sn, In—Ag, Sn—Sb, Au—Sn, and Pb—Sn. More specific examples of solders include 52 In/48 Sn, 58 Bi/42 Sn, 97 In/3 Ag, In, 37 Pb/63 Sn, 96.5 Sn/3.5 Ag, 95 Sn/5 Sb, 80 Au/20 Sn, and 90 Pb/10 Sn (described in terms of weight percentages). The solder material may also include any material (e.g., a solder-material fluxing agent) suitable for removing oxides from the solder material for solder bumps 19. The solder-material fluxing agent may comprise an organic acid, and may be used in combination with a fluxing agent contained in the polymer 16 to remove oxides in and on the soldering material. Organic acids are preferred because they can have relatively high boiling points. Exemplary fluxing agents can include cinnamic acid, succinic acid, gluteric acid, adipic acid, pimelic acid, suberic acid, azelaic acid, adipic acid, sebacic acid, precursors and combinations thereof. The solder-material fluxing agent preferably comprises at least one of cinnamic acid, adipic acid or another acid which functions in a chemically similar manner or has a chemically similar structure. Furthermore, the solder-material fluxing agent can be in the solder material for solder bumps 19 in any suitable percentage, but can preferably constitute from about 0.1 to about 25 weight percent of the solder material.

The solder-material fluxing agent may be substantially non-volatile (e.g., does not boil or volatize in a substantial manner when the conductive composition is cured). In some embodiments, the solder-material fluxing agent may have a melting point of about 100° C., or more. The boiling or decomposition point of the solder-material fluxing agent, whichever is lower, may be greater than the lowest melting point (e.g., greater than about 10° C.) present among conductive particles within solder material for solder bumps 19. The selection of the particular fluxing agent may depend on the particular conductive material used in the solder material for solder bumps 19. For example, the solder-material fluxing agent may be cinnamic acid which has a melting point of about 133° C. and a boiling point of about 300° C. Suitable conductive particles which can be used with cinnamic acid include particles made of 37 Pb/63 Sn solder, which has a melting temperature of about 183° C.

The polymer 16 of the present invention preferably contains no metals, no conductive materials, and no solder materials (i.e., any of the materials that are contained in solder bumps 19). The polymer 16 of the present invention preferably also contains no nonconductive particulates, and preferably possesses fluxing capabilities; thus, the polymer 16 includes a fluxing agent. The polymer 16 functions for joining lower and upper substrates 12 and 14, as well as for providing a polymeric dielectric layer. The polymer 16 further preferably includes very low levels of ionic contaminants and low viscosity (e.g., a viscosity which allows the polymer 16 to flow under the polymeric temperatures of the present invention) so that the polymer 16 may flow around features on both lower and upper substrates 12 and 14. The polymer 16 preferably will not gel before electrically conductive joints 31 (i.e., solder bumps 19 coupling together conductor pads 18 and 20) are formed, and after postcure, the polymer 16 exhibits low dielectric constant, high temperature performance, good adhesion to substrate surfaces and components, and low moisture absorption.

The polymer 16 preferably fluxes oxides at metal surfaces, removes water generated from fluxing of oxides, immobilizes ionic species from fluxing of oxides, and allows for modification of coefficient of thermal expansion as needed. The polymer 16 may be disposed on lower substrate 12 by any suitable method, such as by screen printing as described in the book entitled *Microelectronics Packaging Handbook*, copyrighted 1997 by publisher Chapman & Hall. New York, N.Y., fully incorporated herein by reference thereto. The polymer 16 comprises a polymeric resin, a curing agent or hardener, and a fluxing agent. More specifically, the polymer 16 comprises, or consists essentially of, or consists of from about 15% by weight to about 70% by weight of a polymeric resin, from about 15% by weight to about 70% by weight of a curing agent, and from about 0.10% by weight to about 20% by weight of a fluxing agent; more preferably from about 25% by weight to about 60% by weight of a polymeric resin, from about 25% by weight to about 60% by weight of a curing agent, and from about 1% by weight to about 15% by weight of a fluxing agent; most preferably from about 40% by weight to about 55% by weight of a polymeric resin, from about 40% by weight to about 55% by weight of a curing agent, and from about 4% by weight to about 12% by weight of a fluxing agent. The polymeric resin may be any suitable polymeric resin that preferably has a temperature (e.g., from about 50° C. to about 100° C.) that is lower than its curing or setting temperature, which preferably ranges from about 100° C. to about 150° C. Preferably, the polymeric resin has a curing temperature (e.g., from about 20° C. to about 50° C.) higher than the reflow temperature of the soldering material of solder bumps 19. Also, the polymeric resin may expand when heated, and remain at least partially expanded after cooling. Suitable polymeric resin include epoxy resin made from bisphenol-A and epichlorohydrin, as taught in U.S. Pat. No. 5,128,746, incorporated herein by reference thereto.

Additional suitable polymeric resin include, as illustrated in U.S. Pat. No. 5,579,573, incorporated herein by reference thereto, thermosetting materials, such as high glass transition anhydride-cured epoxy compositions. More particular suitable thermoset materials include, but are not limited to, one or more compounds selected from group consisting of epoxies and modified epoxies, melamine-formaldehydes, urea formaldehydes, phelonic resins, poly(bis-maleimides), acetylene-terminated BPA resins. IPN polymers, triazine resins, and mixtures thereof. Additional suitable polymeric resin may include high temperature thermoplastic materials such as liquid crystal polyesters (e.g., Xydar™ or Vectram™), poly-(ether ether ketones), or the poly(aryl ether ketones). Further additional suitable thermoplastic materials include, by way of example only, ABS containing resinous materials (ABS/PC,ABS/polysulfone, ABS/PVE), acetals acrylics, alkyds, allylic ethers, cellulosic esters, chlorinated polyalkylene ethers, cyanate, cyanamides, furans, polyalkylene ethers, polyamides (Nylons), polyarylene ethers, polybutadienes, polycarbonates, polyesters, polyfluorocarbons, polyimides, polyphenylenes, polyphenylene sulfides, polypropylenes, polystyrenes, polysulfones, polyurethanes, polyvinyl acetates, polyvinyl chlorides, polyvinyl chloride/vinylidine chlorides, polyetherimides, polyether ether imides, and the like, and mixtures of any of the foregoing.

The curing agent or hardener may be any suitable curing agent or hardener, such as an amine or an anhydride. The polymeric resin and the curing agent may be a two part resin system such as polyester resins with suitable hardener or curing agents. For example, a commercially available two part resin system is Furane 89303 epoxy, Part A and Part B. Furane 89303 epoxy, Part A, is a bisphenol A-epichlorohydrin type epoxy resin available from the Furane Products Company of Los Angeles, Calif. Furane 89303 epoxy, Part B, is an anhydride curing agent or hardener also available from the Furane Products Company. It is to be understood that the spirit and scope of the present inventions include other types of two part resin systems which are capable of achieving the desired results within the scope of the invention. The fluxing agent in the polymer 16 assists in the fluxing action for the soldering coupling operation especially if no, or very little, solder-material fluxing agent is admixed in the soldering material of solder bumps 19. Thus, the fluxing agent in the polymer 16 may be an alternative to using a solder-material fluxing agent in the soldering material, or may be used in combination with a solder-material fluxing agent.

The solder-material fluxing agent in the polymer 16 preferably comprises a phenylacid, more preferably beta phenylacid. It has been discovered that beta phenylacid, especially in combination with an epoxy resin, slows down or retards the curing or hardening of the polymer 16, leading to longer gel time and allowing the solder material (e.g. 63 Sn/37 Pb) to melt before the polymeric hardens from its initial liquid state. The acid for beta phenylacid is preferably selected from the acid group consisting of acetic, acrylic, crotonic, caproric, valeric, enanthic acid, octylic acid, pelargonic acid, and capric acid. More preferably, the acid for beta phenylacid is selected from the acid group consisting of acetic, acrylic, crotonic, caproic, valeric and enanthic; most preferably from the acid group consisting of acetic, acrylic and crotonic. Particular improved retardation of polymer curing time, leading to longer gel time, is obtained when the fluxing agent is beta-phenylacrylic acid and/or beta-phenylhydroxyacrylic acid.

The polymer 16 is disposed on the lower substrate 12 in a liquid state, and the upper substrate 14 is moved towards the lower substrate 12, while conductor pads 18-solder bumps 19 on the upper substrate 14 remain aligned with conductor pads 20 on lower substrate 12. The liquid polymer 16 is compressed and squeeze flowed outwardly towards the perimetric edges 12a and 14a of the lower and upper substrates 12 and 14 by continually moving the upper substrate 14 towards the lower substrate 12 until the solder bumps 19 come in contact with conductor pads 20 to produce the assembly of FIG. 2. The liquid polymer 16 preferably completely encapsulates each of the conductor pads 18-solder bumps 19/pads 20. The fluxing agent in the liquid polymer 16 is in a contacting relationship with solder bumps 19. The assembly in FIG. 2 is heated, reflowed in a conventional manner, (e.g. to a temperature ranging from about 200° C. to about 240° C.), causing the fluxing agent in the liquid polymer 16 to be activated and reduce oxides on and in the solder bumps 19, and allowing alloy coupling of solder bumps 19 to conductor pads 20 and form joints 31 (see FIG. 2). As previously indicated, the fluxing agent in the liquid polymer 16 may be used alone as the sole fluxing agent (no fluxing agent is in the solder material), or the fluxing agent in the liquid polymer 16 may be used in combination with a solder-material fluxing agent in the solder material. During the reflow procedure, the fluxing agent in the liquid polymer 16 also retards or slows down the liquid polymer 16 from curing or hardening, especially when betaphenylacrylic acid and/or beta-phenylhydroxyacrylic acid is employed as the fluxing agent.

Thus, joints 31 are formulated before the liquid polymer 16 has been completely cured or hardened. After joints 31 are formulated, a post curing procedure (e.g., at a temperature ranging from about 100° C. to about 180° C.) may be required to completely cure the liquid polymer 16.

Thus, by the practice of embodiments of the present invention there is provided a simple approach to joining of large area substrates. Conventional underfill process for flip chip to substrate joining is limited to very small joining areas (typically 1-inch by 1-inch area or less). Substrate buildup is expensive compared to the simpler approach described in embodiments of this invention. Joining of similar or different substrate materials (i.e., flexible substrates, rigid wafers, and laminated circuit boards) can be performed without substantial process modification. The joining process can be automated for high speed, low cost joining of large area substrates.

While the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope and spirit of the invention as set forth. Therefore, many modifications may be made to adapt a particular situation or material to the teachings of the invention not be limited to the particular embodiment disclosed as the best mode contemplated for carrying out this invention, but that the invention will include all embodiments and equivalents falling within the scope of the appended claims.

What is claimed is:

1. A method for producing an assembly of substrates comprising:
   dispensing a liquid polymeric material on one of a conducting surface on a first substantially planar substrate and a conducting surface on a second substantially planar substrate, at least one of said conducting surfaces having solder deposited thereon,
   placing the first substrate on the second substrate such that the liquid polymeric is disposed inwardly from the edges of the first and the second substrate;
   pressing the liquid polymeric material between the first and the second substrate so that the liquid polymeric material flows towards the edges of the first substrate and the second substrate;
   contacting the conducting surface on the first substrate and the conducting surface on the second substrate and melting the solder to form an a solder joint between said conducting surfaces; and
   curing the liquid polymeric material, wherein said solder joint is formed before said polymer hardens.

2. The method of claim 1 wherein the liquid polymeric material is dispensed on dies present on the first or second substrate.

3. The method of claim 1 wherein at least one of the substrates has a planar surface area of at least about 36 sq. inches.

4. The method of claim 1 wherein said conducting surface of said first planar substrate includes first conductive pads, and said conducting surface of said second planar substrate includes second conductive pads and solder bumps disposed on said second conductive pads.

5. The method of claim 4 wherein said solder bumps comprise a solder material fluxing agent.

6. The method of claim 5 wherein said liquid polymeric material comprises a polymer fluxing agent.

7. The method of claim 6 wherein said polymer fluxing agent comprises a beta phenylacid and/or a beta phenylhydroxyacid.

8. The method of claim 7 wherein said beta phenylacid is selected from the group consisting of beta phenylacetic acid, beta phenylacrylic acid, beta phenylcrotonic acid, and mixtures thereof.

9. The method of claim 4 wherein said solder bumps includes no solder material fluxing agent and said liquid polymeric material comprises a polymer fluxing agent.

10. The method of claim 9 wherein said polymer fluxing agent comprises a beta phenylacid and/or a beta phenylhydroxyacid.

11. The method of claim 10 wherein said beta phenylacid is selected from the group consisting of beta phenylacetic acid, beta phenylacrylic acid, beta phenylcrotonic acid, and mixtures thereof.

12. The method of claim 1 wherein said liquid polymeric material comprises a polymer fluxing agent.

13. The method of claim 12 wherein said polymer fluxing agent retards the curing time of the polymer.

14. The method of claim 1 wherein said liquid polymeric material comprises from about 15% by weight to about 70% by weight of a polymeric resin, from about 15% by weight to about 70% by weight of a curing agent, and from about 0.10% by weight to about 20% by weight of a fluxing agent.

15. The method of claim 1 wherein at least a portion of the step of curing said liquid polymeric material after said solder joint has been formed is performed at a temperature which is lower than the melting point of said solder.

16. The method of claim 15 wherein the step of forming a conductive joint is performed at a temperature in the range of about 200° C. to about 240° C., and said lower curing temperature is in the range of about 100° C. to about 180° C.

17. The method of claim 1 wherein the liquid polymeric material is dispensed at multiple points.

18. The method of claim 1 wherein said method is performed in a vacuum.

19. The method of claim 1 wherein said liquid polymer contains no metallic or conductive particles.

20. A method for producing an assembly of substrates comprising:
   dispensing a liquid polymeric material on one of a conducting surface on a first substantially planar substrate and a conducting surface on a second substantially planar substrate, the liquid polymeric being disposed inwardly from the edges of the first and the second substrate;
   pressing the liquid polymeric material between the first and the second substrate so that the liquid polymeric material flows towards the edges of the first substrate and the second substrate; and curing the liquid polymeric material, wherein said conducting surface of said first planar substrate includes first conductive pads, and said conducting surface of said second planar substrate includes second conductive pads and solder bumps disposed on said second conductive pads, wherein said solder bumps comprise a solder material fluxing agent, wherein said liquid polymeric material comprises a polymer fluxing agent, wherein said polymer fluxing agent comprises a beta phenylacid and/or a beta phenylhydroxyacid, and wherein said beta phenylarid comprises beta phenylacrylic acid and said beta phenylhydroxyacid comprises beta phenylhydroxyacrylic acid.

21. A method for producing an assembly of substrates comprising:

dispensing a liquid polymeric material on one of a conducting surface on a first substantially planar substrate and a conducting surface on a second substantially planar substrate, the liquid polymeric being disposed inwardly from the edges of the first and the second substrate;

pressing the liquid polymeric material between the first and the second substrate so that the liquid polymeric material flows towards the edges of the first substrate and the second substrate; and curing the liquid polymeric material, wherein said conducting surface of said first planar substrate includes first conductive pads, and said conducting surface of said second planar substrate includes second conductive pads and solder bumps disposed on said second conductive pads, wherein said solder bumps includes no solder material fluxing agent and said liquid polymeric material comprises a polymer fluxing agent, wherein said polymer fluxing agent comprises a beta phenylacid and/or a beta phenylhydroxyacid, and wherein said beta phenylacid comprises beta phenylacrylic acid and said beta phenylhydroxyacid comprises beta phenylhydroxyacrylic acid.

* * * * *